United States Patent [19]
Tehrani et al.

[11] Patent Number: 5,804,458
[45] Date of Patent: Sep. 8, 1998

[54] METHOD OF FABRICATING SPACED APART SUBMICRON MAGNETIC MEMORY CELLS

[75] Inventors: Saied N. Tehrani, Tempe; Mark Durlam, Chandler; Herbert Goronkin, Tempe, all of Ariz.

[73] Assignee: Motorola, Inc., Schaumburg, Ill.

[21] Appl. No.: 766,076

[22] Filed: Dec. 16, 1996

[51] Int. Cl.⁶ .................................................. H01L 21/70
[52] U.S. Cl. .................................................. 438/3; 438/595
[58] Field of Search ...................... 438/3, 48, 238, 438/595

[56] References Cited

U.S. PATENT DOCUMENTS

5,389,566 2/1995 Lage ............................................ 438/3
5,569,617 10/1996 Yeh .............................................. 438/3

*Primary Examiner*—Chandra Chaudhari
*Attorney, Agent, or Firm*—Eugene A. Parsons

[57] ABSTRACT

A method of fabricating a plurality of spaced apart submicron memory cells is disclosed, including the steps of depositing a magnetoresistive system on a substrate formation, depositing and patterning a first layer of material to form sidewalls, and depositing a second, selectively etchable, layer of material on the first layer of material, etching the second layer of material to define spacers on the sidewalls of the first layer of material, etching the magnetoresistive system, using the spacers as a mask, to define a plurality of spaced apart submicron magnetic memory cells, and depositing electrical contacts on the plurality of spaced apart submicron magnetic memory cells.

27 Claims, 5 Drawing Sheets

METHOD OF FABRICATING SPACED APART SUBMICRON MAGNETIC MEMORY CELLS

FIELD OF THE INVENTION

The present invention pertains to arrays of magnetic memory cells and more specifically to methods of fabrication of submicron arrays of magnetic memory cells.

BACKGROUND OF THE INVENTION

A magnetic random access memory (MRAM) is a non-volatile memory which basically includes a giant magnetoresistive (GMR) material, a word line and, in some embodiments, an additional writing line. The MRAM employs the GMR effect in a plurality of layers of GMR material to store memory states. Magnetic vectors in one or all of the layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. In this type of device the sense current passes through the cell along the longitudinal axis. The states stored in the GMR material can be read by a sense line. That is, the magnetic vectors in the GMR material cause a different current flow in the sense line because of a different magnetic resistance due to the direction of the magnetic vectors.

In all prior art magnetic random access memories, the GMR ratio is relatively low, which increases the required sensitivity of apparatus utilized to sense (read) the stored state of such a memory cell. One major factor which effects the characteristics and the operation of the memory cells is the size and quality of the cells, which is generally determined by manufacturing processes. The fabrication, including dimensions and spacing, is especially important in arrays of submicron devices and is especially hard to achieve.

Further, many attempts are being made to integrate high density, non-volatile magnetic memories with semiconductor devices. In particular, semiconductor devices, such as various CMOS circuits, can be used for switching and otherwise controlling arrays of high density, non-volatile magnetic memories. The CMOS circuits are highly desirable because of the low currents required and high efficiency.

Accordingly, it is highly desirable to provide magnetic random access memories and memory cells which can be accurately fabricated with a high quality.

It is a purpose of the present invention to provide new and improved GMR memory cells.

It is another purpose of the present invention to provide new and improved arrays of improved GMR memory cells.

It is still another purpose of the present invention to provide new and improved GMR memory cells which are simpler and less expensive to fabricate.

It is a further purpose of the present invention to provide new and improved arrays of GMR memory cells which are simpler and less expensive to fabricate.

It is still a further purpose of the present invention to provide new and improved arrays of GMR memory cells which are simpler and less expensive to integrate on semiconductor substrates.

SUMMARY OF THE INVENTION

The above described problems and others are at least partially solved and the above described purposes and others are realized in a method of fabricating a plurality of spaced apart submicron memory cells including the steps of providing a supporting substrate formation with a planar surface. A magnetoresistive system is deposited on the surface of the substrate formation. A first layer of material is then deposited on top of the magnetoresistive system and the planar surface. The first layer is then patterned and etched to form sidewalls. A second layer of material is deposited on the first layer of material at least on the sidewalls, the first layer of material and the second layer of material being selectively etchable from each other. The second layer of material is then etched to define spacers on the sidewalls of the first layer of material. The magnetoresistive system is etched, using the spacers as a mask, to define a plurality of spaced apart submicron magnetic memory cells and the sidewall spacers are removed. Electrical contacts are deposited on the plurality of spaced apart submicron magnetic memory cells.

The above described problems and others are at least partially solved and the above described purposes and others are further realized in another method of fabricating a plurality of spaced apart submicron memory cells including the steps of providing a supporting substrate formation with a planar surface, depositing a magnetoresistive system on the surface of the substrate formation, depositing a first layer of material and patterning the first layer of material to form sidewalls, and depositing a second layer of material on the first layer of material at least on the sidewalls, the first layer of material and the second layer of material being selectively etchable from each other. The second layer of material is then etched to define spacers on the sidewalls of the first layer of material and the magnetoresistive system is etched, using the spacers and the first layer of material as a mask, to define a plurality of spaced apart submicron magnetic memory cells. The sidewall spacers are removed and electrical contacts are deposited on the plurality of spaced apart submicron magnetic memory cells, using the first layer of material as a mask.

BRIEF DESCRIPTION OF THE DRAWINGS

Referring to the drawings.

DESCRIPTION OF THE PREFERRED EMBODIMENTS

Figure 1:
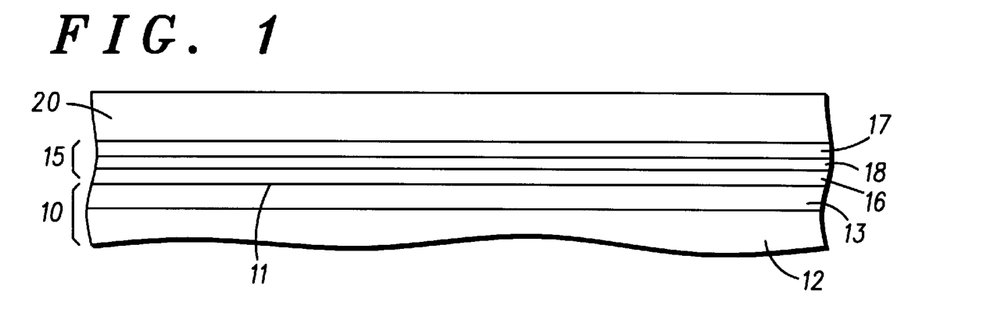
FIGS. 1–6 are simplified cross-section and top plan views illustrating several steps in a method of fabricating a plurality of spaced apart submicron memory cells in accordance with the present invention.
Figure 2:
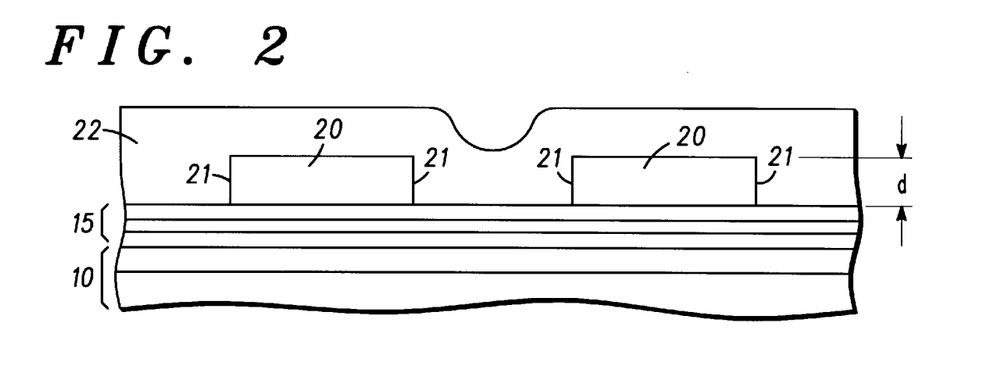
Figure 3:
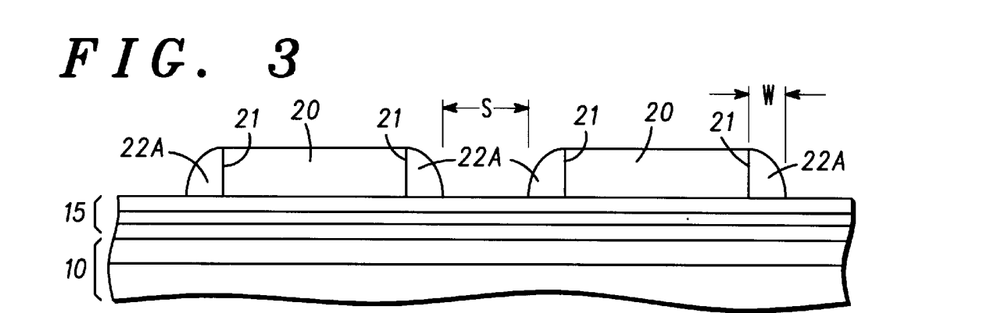

Turning now to the drawings, FIGS. 1–6 are simplified cross-section and top plan views illustrating several steps in a method of fabricating a plurality of spaced apart submicron memory cells in accordance with the present invention. Referring specifically to FIG. 1, a simplified cross-sectional view is illustrated of a supporting substrate formation 10 having an upper surface 11. While the construction of supporting substrate formation 10 may vary between a simple supporting substrate and a plurality of layers formed on a supporting substrate, some of which may contain semiconductor devices, interconnections, etc. in this embodiment supporting substrate formation 10 includes a semiconductor substrate 12, e.g., silicon, silicon carbide, gallium arsenide, etc., and a dielectric layer 13 deposited thereon. Dielectric layer 13 may be any convenient material, such as $SiO_2$, $Si_3N_4$, etc. Dielectric layer 13 is processed to form surface 11 which is suitably smooth to allow the further processing thereof.

A magnetoresistive system 15 is positioned on surface 11 of supporting substrate formation 10 by some convenient method such as deposition by sputtering. In general, magnetoresistive system 15 will include at least two layers 16 and 17 of magnetoresistive material with a layer 18 of non-magnetic material sandwiched therebetween. In a typical example, magnetoresistive system 15 includes a thin layer of tantalum (Ta), several layers of NiFeCo, a layer of copper (Cu), followed by several layers of NiFeCo, and a layer of Ta. It will of course be understood that this disclosure includes any magnetoresistive system which can be positioned on surface 11 and formed into memory cells.

A first layer 20 of etchable material is positioned on magnetoresistive system 15 as disclosed in FIG. 1. First layer 20 is any convenient material which can later be used as an etch mask, a preferable material being $Si_3N_4$. First layer 20 is then patterned, as illustrated in the simplified cross-sectional view of FIG. 2, to generally define the length and width of a plurality of memory cells, as will be understood presently. Here it should be noted that the length and width of each memory cell is important to the operation of the memory cell. Also, the spacing between the memory cells can be important. Layer 20 is patterned to form sidewalls 21 positioned in inwardly spaced relation from a line that will become the edges of each of the memory cells.

A second layer 22 of etchable material is conformally deposited over patterned layer 20 and the exposed portions of surface 11 of magnetoresistive system 15. Layer 22 can be any convenient material, e.g., $SiO_2$, or the like, and generally is chosen to be selectively etchable over first layer 20. While the preferred method is to conformally deposit layer 22, it will be understood that layer 22 should be sufficient to at least cover sidewalls 21. Layer 22 is then isotropically etched (generally vertically) using some convenient etching technique, such as a reactive ion etch (RIE) to produce sidewall spacers 22a, as illustrated in the simplified cross-sectional view of FIG. 3. It should be noted that the width 'w' of sidewall spacers 22a is primarily determined by the depth 'd' of layer 22. Thus, patterned layer 20 essentially forms islands of material on surface 11 and sidewall spacers 22a in conjunction with these islands, in this embodiment, accurately define each of the memory cells.

Figure 4:
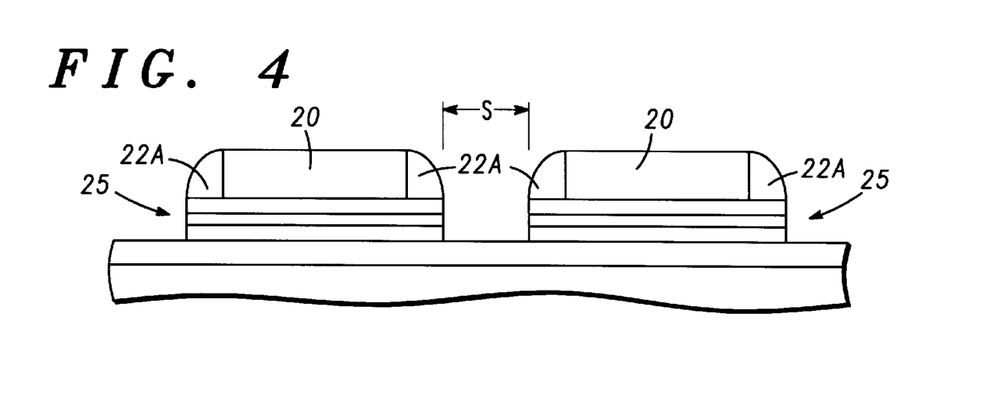
Figure 5:
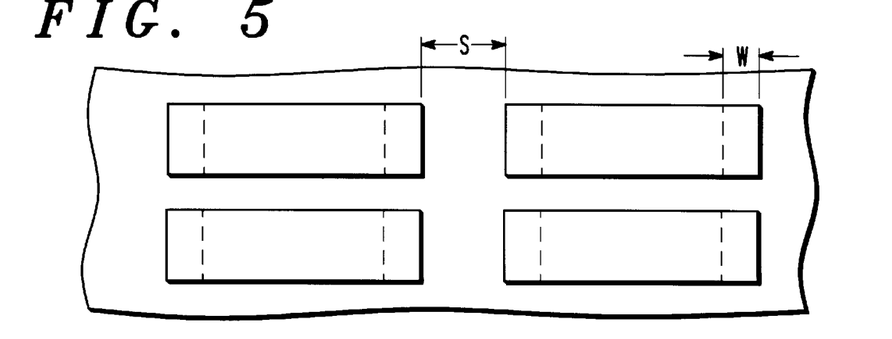
Figure 6:
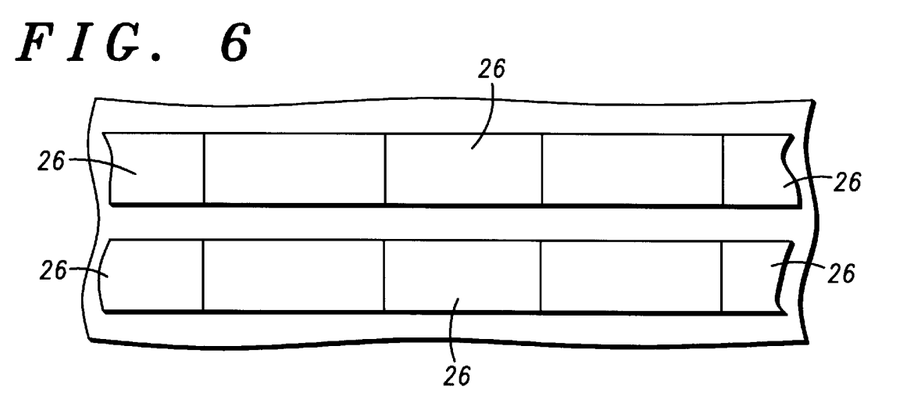

Magnetoresistive system 15 is etched, using sidewall spacers 22a and the islands of patterned layer 20 as a mask, to define a plurality of spaced apart submicron magnetic memory cells 25, as illustrated in the simplified cross-sectional view of FIG. 4 and the view in top plan of FIG. 5. It should be noted that the width 'w' of sidewall spacers 22a can be conveniently controlled by adjusting the depth 'd' of layer 22. Since the depth 'd' of layer 22 can be very accurately controlled (this generally depends on a very reliable and accurate deposition rate), the width 'w' can be very accurately controlled and the length and width of memory cells 25 can be very accurately controlled. Also the cell spacing 's' between adjacent cells can be accurately controlled. Here it should also be noted that the dimensions of memory cells 25 and the cell spacing 's' are all determined in a single procedure, or etching step.

Sidewall spacers 22a are then removed while layer 20 is retained for the final step of depositing electrical contacts 26 in contact with each end of each memory cell 25 in the array, to connect memory cells 25 into spaced apart rows of spaced apart memory cells. In a preferred embodiment, electrical contacts 26, illustrated in the simplified top plan view of FIG. 6, include a first layer of high coercivity material deposited on memory cells 26 to pin magnetic vectors in the ends of magnetoresistive system 15 in a fixed direction and define the ends of spaced apart submicron magnetic memory cells 25. A layer of metal is then deposited on the layer of high coercivity material to electrically connect the ends of spaced apart submicron magnetic memory cells 25. It should be noted that sidewalls 22a not only aid in defining the dimensions of memory cells 25 and the spacing 's' between adjacent cells, but also provide a self-aligned mask for the deposition of electrical contacts 26.

Figure 7:
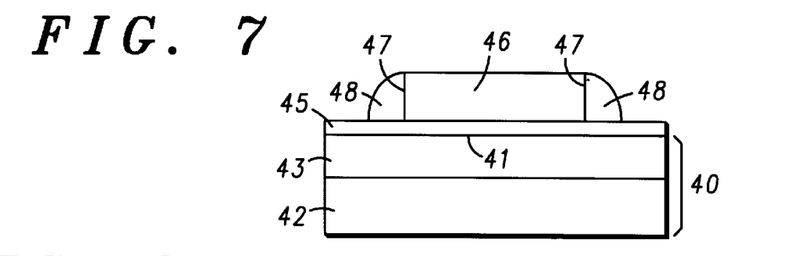
FIGS. 7–13 are simplified cross-section and top plan views illustrating several steps in another method of fabricating a plurality of spaced apart submicron memory cells in accordance with the present invention.
Figure 8:
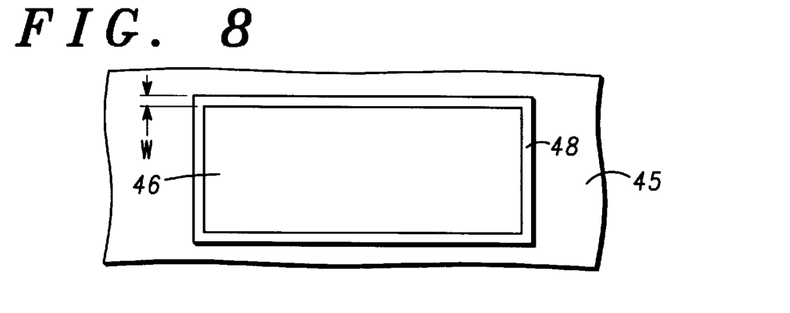
Figure 9:
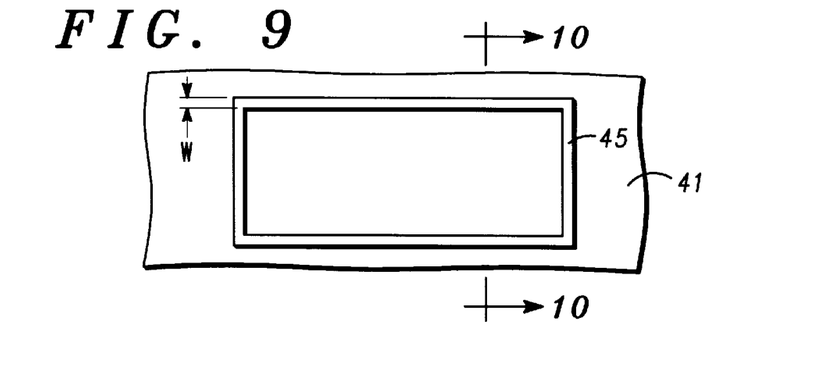

Turning now to FIGS. 7–13, simplified cross-sectional and top plan views are illustrated showing several steps in another method of fabricating a plurality of spaced apart submicron memory cells in accordance with the present invention. Referring specifically to FIG. 7, a simplified cross-sectional view is illustrated showing a structure substantially similar to that of FIG. 3. In FIG. 7, a supporting substrate formation 40 is provided having an upper surface 41. As described in conjunction with FIG. 1, the construction of supporting substrate formation 40 may vary between a simple supporting substrate and a plurality of layers formed on a supporting substrate, some of which may define semiconductor devices, interconnections, etc. In this embodiment supporting substrate formation 40 includes a semiconductor substrate 42, which is a silicon integrated circuit chip, and a dielectric layer 43 deposited thereon. Dielectric layer 43, in this specific example is a combination of $SiO_2/Si_3N_4$. Dielectric layer 43 is processed to form surface 41 which is suitably smooth to allow the further processing thereof.

A magnetoresistive system 45 is positioned on surface 41 of supporting substrate formation 40 by some convenient method. While magnetoresistive system 45 will generally include at least two layers of magnetoresistive material separated by a non-magnetic material, it will of course be understood that this disclosure includes any magnetoresistive system which can be positioned on surface 41 and formed into memory cells. A first layer 46 of etchable material is positioned on magnetoresistive system 45 and patterned to form sidewalls 47. A second layer is positioned at least on sidewalls 47, for example by conformal deposition, and the second layer is etched to form sidewall spacers 48, as illustrated in the simplified cross-sectional view of FIG. 7 and the top plan view of FIG. 8. Generally, an etch process, such as RIE, is utilized to provide a suitable isotropic (vertical) etching to provide appropriate sidewall spacers 48 with a required width 'w'.

Figure 10:
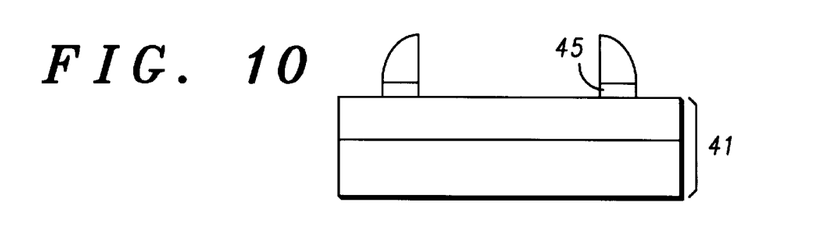
Figure 11:
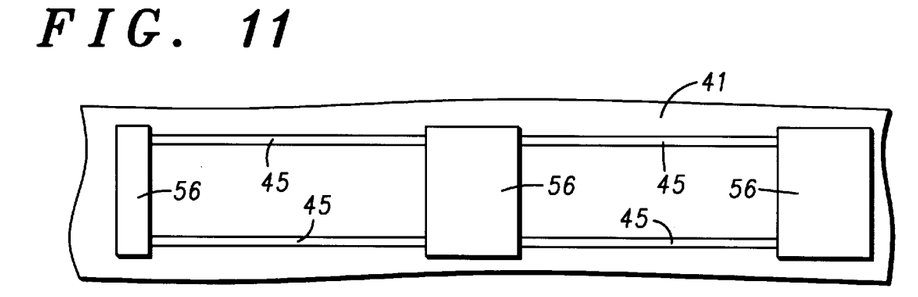
Figure 12:
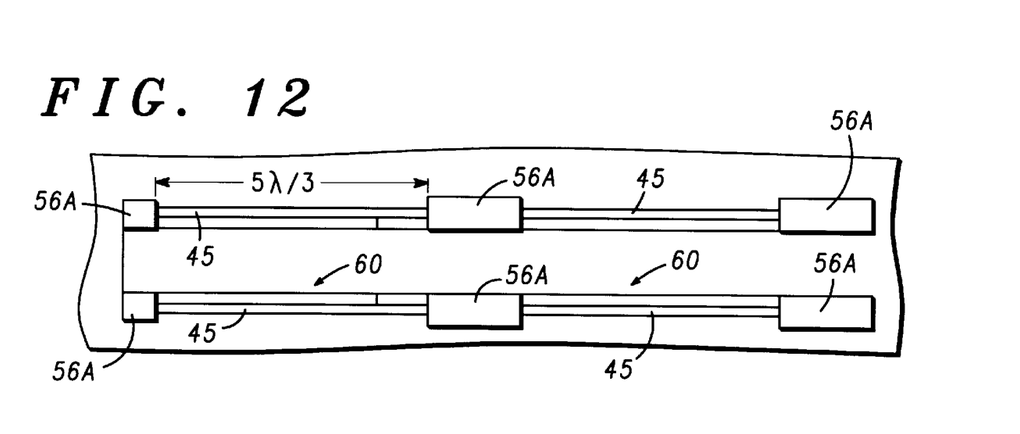

Once sidewall spacers 48 are formed, first layer 46 is selectively etched, or removed, so that only sidewall spacers 48 remain on the surface of magnetoresistive layer 45. Magnetoresistive system 45 is then etched, using sidewall spacers 48 as a mask, to define a continuous 'racetrack' or oval shaped portion of magnetoresistive layer 45, as illustrated in the top plan of FIG. 9 and the simplified cross-sectional view of FIG. 10 (FIG. 10 is a view seen from line 10—10 of FIG. 9). It should be noted that the width 'w' of sidewall spacers 48 can be conveniently controlled by adjusting the depth 'd' of the second layer. Since the depth 'd' of the second layer can be very accurately controlled (this generally depends on a very reliable and accurate deposition rate), the width 'w' can be very accurately controlled.

Sidewall spacers 48 are then removed in preparation for the step of depositing electrical contacts and forming the remaining portion of magnetoresistive layer 45 into an array of memory cells in spaced apart rows of spaced apart memory cells. In a preferred embodiment, a first layer of high coercivity material 56 is deposited on the remaining portion of magnetoresistive layer 45, as illustrated in the simplified top plan view of FIG. 11. High coercivity material 56 divides the remaining portion of magnetoresistive layer 45 into portions of the correct length by defining the ends of each memory cell. As explained previously, high coercivity material 56 pins magnetic vectors in the defined ends of the remaining portion of magnetoresistive layer 45 in a fixed direction and defines spaced apart submicron magnetic memory cells.

A layer of metal (included in the designation 56) is then deposited on the layer 56 of high coercivity material to electrically connect the defined ends. Electrical contacts 56a are then formed so as to define separate memory cells 60 and to connect the ends of the separate memory cells 60 in series to form an array of rows of memory cells 60. Electrical contacts 56a are formed from layers 56 by patterning and etching layers 56 to separate memory cells 60 into serially connected rows, as illustrated in the simplified top plan view of FIG. 12. Thus, contacts 56a not only electrically connect adjacent memory cells 60, but also define the length 'l' of each memory cell 60.

Figure 13:
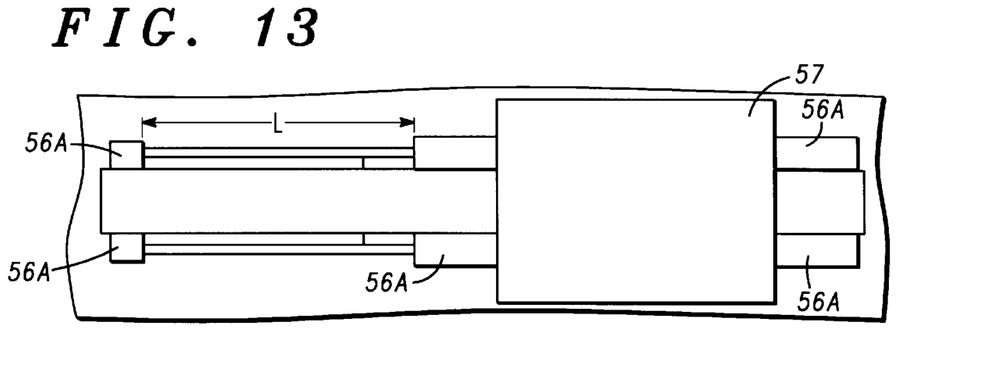

A word line 57 is deposited over a column of memory cells 60 so as to extend perpendicular to the rows of memory cells 60, as illustrated in the top plan view of FIG. 13. Word line 57 is formed from a layer of electrically conductive material, such as metal, and is deposited and patterned in some convenient technique to produce a metal lead extending parallel to the columns of memory cells 60. As will be understood by those skilled in the art, a word line 57 is provided for each column of memory cells 60 and provides a means for writing a selected state into each memory cell 60. Each memory cell 60 is addressed by selecting the particular row the cell is in and the word line which crosses the cell.

Thus, this method is utilized to fabricate spaced apart submicron memory cells 60 with very accurate widths 'w' and lengths 'l'. Further, the method is relatively simple to use because the formation of the electrical contacts also defines the length of submicron memory cells 60. Therefore, the length and width of each submicron memory cells 60 is very accurately determined, which greatly improves the characteristics and subsequent operation of submicron memory cells 60.

Figure 14:
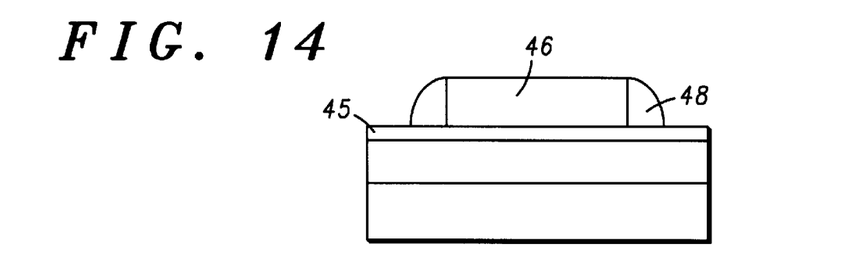
FIGS. 14–18 are simplified cross-section and top plan views illustrating several steps in yet another method of fabricating a plurality of spaced apart submicron memory cells in accordance with the present invention.
Figure 15:
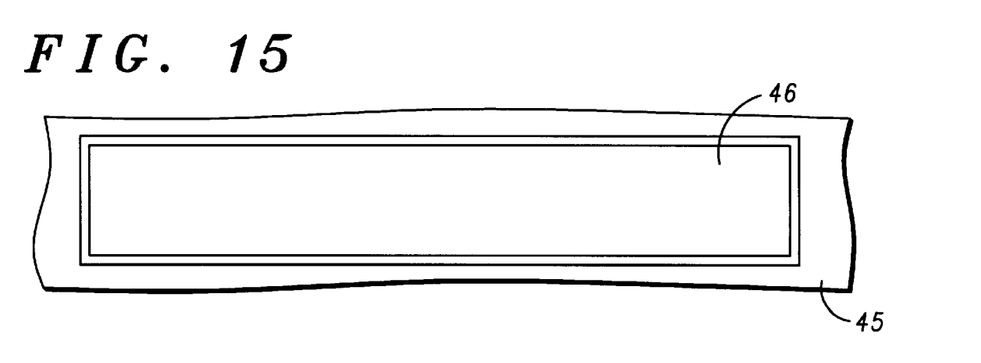
Figure 16:
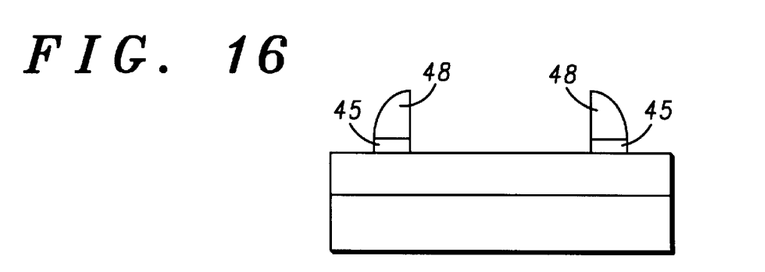
Figure 17:
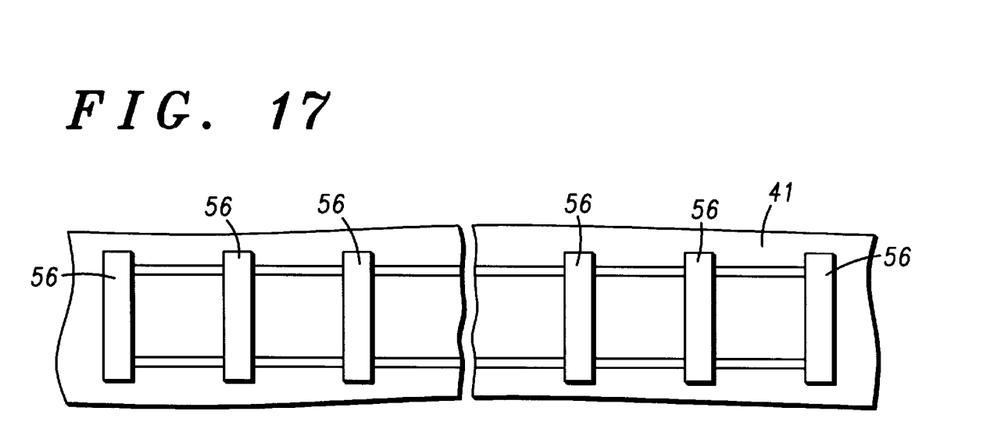

Turning now to FIGS. 14–18, simplified cross-sectional and top plan views are illustrated showing several steps in another method of fabricating a plurality of spaced apart submicron memory cells in accordance with the present invention. Referring specifically to FIGS. 14 and 15, a simplified cross-sectional view and top plan view are illustrated showing a structure substantially similar to that of FIGS. 7 and 8. Because this embodiment is substantially similar to the embodiment illustrated in FIGS. 7–13, similar components have been designated with similar numbers. The difference in this embodiment is that the length of the structure illustrated in FIG. 15 is the length of an entire row of submicron memory cells 60.

As previously explained, once sidewall spacers 48 are formed, first layer 46 is selectively etched, or removed, so that only sidewall spacers 48 remain on the surface of magnetoresistive layer 45. Magnetoresistive system 45 is then etched, using sidewall spacers 48 as a mask, to define a continuous 'racetrack' or oval shaped portion of magnetoresistive layer 45, as illustrated in the top plan of FIG. 15 and the simplified cross-sectional view of FIG. 16

Sidewall spacers 48 are then removed in preparation for the step of depositing electrical contacts and forming the remaining portion of magnetoresistive layer 45 into an array of memory cells in spaced apart rows of spaced apart memory cells. In a preferred embodiment, strips of high coercivity material 56 are selectively deposited (by well known masking techniques or the like) on the remaining portion of magnetoresistive layer 45, as illustrated in the simplified top plan view of FIG. 11. High coercivity material 56 divides the remaining portion of magnetoresistive layer 45 into portions of the correct length by defining the ends of each memory cell. As explained previously, high coercivity material 56 pins magnetic vectors in the defined ends of the remaining portion of magnetoresistive layer 45 in a fixed direction and defines spaced apart submicron magnetic memory cells.

A layer of metal (included in the designation 56) is then deposited on the layer 56 of high coercivity material to electrically connect the defined ends. Generally, the deposition of the high coercivity material and the electrically conductive material will be done using the same masking procedures. Electrical contacts 56a are then formed so as to define separate memory cells 60 (i.e., separate the adjacent rows of cells) and to connect the ends of the separate memory cells 60 in series to form an array of rows of memory cells 60. Electrical contacts 56a are formed from layers 56 by patterning and etching layers 56 to separate memory cells 60 into serially connected rows, as illustrated in the simplified top plan view of FIG. 18. Thus, contacts 56a not only electrically connect adjacent memory cells 60, but also define the length 'l' of each memory cell 60.

Figure 18:
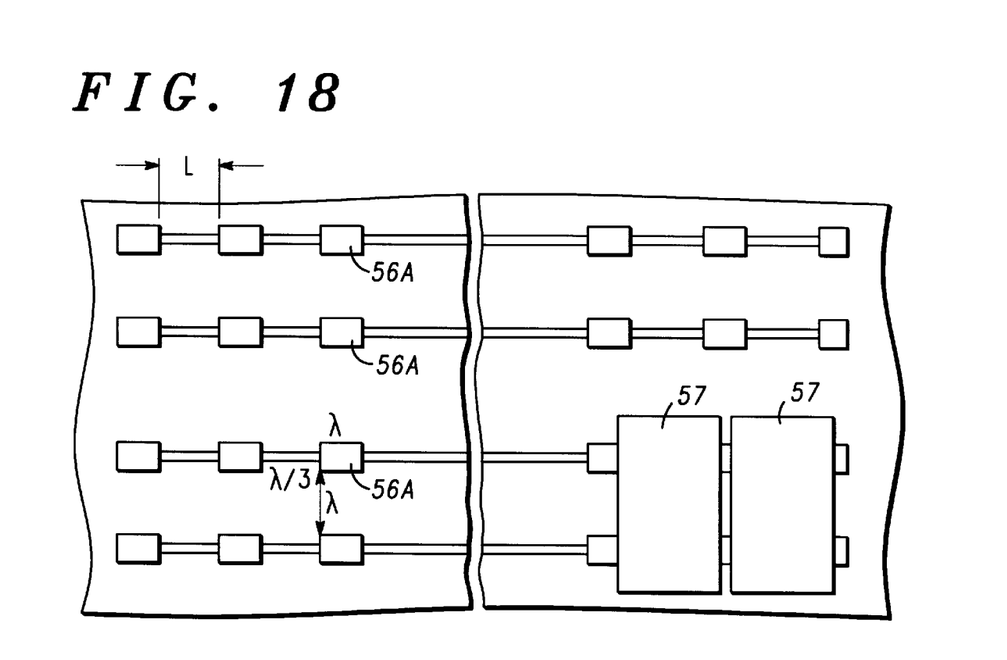

Word lines 57 are deposited over each column of memory cells 60 so as to extend perpendicular to the rows of memory cells 60, as illustrated in the top plan view of FIG. 18. As previously described, word lines 57 are formed from a layer of electrically conductive material, such as metal, and is deposited and patterned in some convenient technique to produce a metal lead extending parallel to the columns of memory cells 60.

Thus, this method is utilized to fabricate large arrays of spaced apart submicron memory cells 60, in complete rows, with very accurate widths 'w' and lengths 'l'. Further, the method is relatively simple to use because the formation of the electrical contacts also defines the length of submicron memory cells 60. Therefore, the length and width of each submicron memory cells 60 is very accurately determined, which greatly improves the characteristics and subsequent operation of submicron memory cells 60. Further, in this embodiment a complete array of spaced apart submicron memory cells 60 is produced in a single fabrication process.

Accordingly, methods of accurately fabricating magnetic random access memories and memory cells with very good characteristics have been disclosed. The new and improved GMR memory cells and arrays of improved GMR memory cells are simpler and less expensive to fabricate and are simpler and less expensive to integrate on semiconductor substrates. Because the length and width dimensions of the memory cells can be very accurately defined by the present methods, the memory cells have better characteristics, such as a larger GMR ratio, lower operating currents, etc. Further, the individual memory cells in arrays of cells are more accurately defined and more accurately separated from adjacent cells so that interactions between adjacent cells is minimized.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a plurality of spaced apart submicron memory cells comprising the steps of:
    providing a supporting substrate formation with a planar surface;
    depositing a magnetoresistive system on the surface of the substrate formation;
    depositing a first layer of material and patterning the first layer of material to form sidewalls;
    depositing a second layer of material on the first layer of material at least on the sidewalls, the first layer of material and the second layer of material being selectively etchable from each other;
    etching the second layer of material to define spacers on the sidewalls of the first layer of material;
    etching the magnetoresistive system, using the spacers as a mask, to define a plurality of spaced apart submicron magnetic memory cells;
    removing the sidewall spacers; and
    depositing electrical contacts on the plurality of spaced apart submicron magnetic memory cells.

2. A method of fabricating a plurality of spaced apart submicron memory cells as claimed in claim 1 wherein the step of providing the supporting substrate formation includes providing a semiconductor substrate and depositing a layer of dielectric material thereon to form the planar surface.

3. A method of fabricating a plurality of spaced apart submicron memory cells as claimed in claim 2 wherein the step of depositing the magnetoresistive system includes depositing at least two layers of giant magnetoresistive material with a layer of nonmagnetic material sandwiched therebetween.

4. A method of fabricating a plurality of spaced apart submicron memory cells as claimed in claim 1 wherein the step of patterning the first layer of material to form sidewalls includes patterning the first layer of material to define a sidewall spacing between the sidewalls that defines a cell spacing between the plurality of spaced apart submicron magnetic memory cells.

5. A method of fabricating a plurality of spaced apart submicron memory cells as claimed in claim 1 wherein the step of depositing the second layer of material on the first layer includes conformally depositing the second layer on the first layer.

6. A method of fabricating a plurality of spaced apart submicron memory cells as claimed in claim 5 wherein the step of etching the second layer of material to define spacers includes performing a reactive ion etch on the second layer.

7. A method of fabricating a plurality of spaced apart submicron memory cells as claimed in claim 1 wherein the steps of depositing the first layer of material and depositing the second layer of material include depositing a first layer of $Si_3N_4$ and depositing a second layer of $SiO_2$.

8. A method of fabricating a plurality of spaced apart submicron memory cells as claimed in claim 1 wherein the step of depositing electrical contacts includes depositing and patterning high coercivity material on the magnetoresistive system to pin magnetic vectors in the magnetoresistive material and define ends of the spaced apart submicron magnetic memory cells.

9. A method of fabricating a plurality of spaced apart submicron memory cells as claimed in claim 8 wherein the step of depositing electrical contacts further includes depositing a layer of metal on the high coercivity material to electrically connect the ends of the spaced apart submicron magnetic memory cells.

10. A method of fabricating a plurality of spaced apart submicron memory cells comprising the steps of:
    providing a supporting substrate formation with a planar surface;
    depositing a magnetoresistive system on the surface of the substrate formation;
    depositing a first layer of material and patterning the first layer of material to form sidewalls;
    depositing a second layer of material on the first layer of material at least on the sidewalls, the first layer of material and the second layer of material being selectively etchable from each other;
    etching the second layer of material to define spacers on the sidewalls of the first layer of material;
    etching the magnetoresistive system, using the spacers and the first layer of material as a mask, to define a plurality of spaced apart submicron magnetic memory cells;
    removing the sidewall spacers; and
    depositing electrical contacts on the plurality of spaced apart submicron magnetic memory cells, using the first layer of material as a mask.

11. A method of fabricating a plurality of spaced apart submicron memory cells as claimed in claim 10 wherein the step of providing the supporting substrate formation includes providing a semiconductor substrate and depositing a layer of dielectric material thereon to form the planar surface.

12. A method of fabricating a plurality of spaced apart submicron memory cells as claimed in claim 11 wherein the step of depositing the magnetoresistive system includes depositing at least two layers of giant magnetoresistive material with a layer of nonmagnetic material sandwiched therebetween.

13. A method of fabricating a plurality of spaced apart submicron memory cells as claimed in claim 10 wherein the step of patterning the first layer of material includes patterning the first layer of material to define the plurality of spaced apart submicron magnetic memory cells.

14. A method of fabricating a plurality of spaced apart submicron memory cells as claimed in claim 10 wherein the step of patterning the first layer of material includes etching the second layer of material to define spacers and to define a sidewall spacing between the sidewalls that defines a cell spacing.

15. A method of fabricating a plurality of spaced apart submicron memory cells as claimed in claim 10 wherein the step of depositing the second layer of material on the first layer includes conformally depositing the second layer on the first layer.

16. A method of fabricating a plurality of spaced apart submicron memory cells as claimed in claim 15 wherein the step of etching the second layer of material to define spacers includes performing a reactive ion etch on the second layer.

17. A method of fabricating a plurality of spaced apart submicron memory cells as claimed in claim 10 wherein the steps of depositing the first layer of material and depositing the second layer of material include depositing a first layer of $Si_3N_4$ and depositing a second layer of $SiO_2$.

18. A method of fabricating a plurality of spaced apart submicron memory cells as claimed in claim 10 wherein the step of depositing electrical contacts includes depositing and patterning high coercivity material on the magnetoresistive system to pin magnetic vectors in the magnetoresistive material and define ends of the spaced apart submicron magnetic memory cells.

19. A method of fabricating a plurality of spaced apart submicron memory cells as claimed in claim 18 wherein the step of depositing electrical contacts further includes depositing a layer of metal on the high coercivity material to electrically connect the ends of the spaced apart submicron magnetic memory cells.

20. A method of fabricating a plurality of spaced apart submicron memory cells comprising the steps of:

providing a supporting substrate formation with a planar surface;

depositing a magnetoresistive system on the surface of the substrate formation;

depositing a first layer of material and patterning the first layer of material to form sidewalls;

depositing a second layer of material on the first layer of material at least on the sidewalls, the first layer of material and the second layer of material being selectively etchable from each other;

etching the second layer of material to define spacers on the sidewalls of the first layer of material;

removing the first layer of material so as to leave the spacers;

etching the magnetoresistive system, using the spacers as a mask, to define a plurality of spaced apart submicron magnetic memory cells;

removing the sidewall spacers; and depositing electrical contacts on the plurality of spaced apart submicron magnetic memory cells.

21. A method of fabricating a plurality of spaced apart submicron memory cells as claimed in claim 20 wherein the step of providing the supporting substrate formation includes providing a semiconductor substrate and depositing a layer of dielectric material thereon to form the planar surface.

22. A method of fabricating a plurality of spaced apart submicron memory cells as claimed in claim 20 wherein the step of depositing the magnetoresistive system includes depositing at least two layers of giant magnetoresistive material with a layer of nonmagnetic material sandwiched therebetween.

23. A method of fabricating a plurality of spaced apart submicron memory cells as claimed in claim 20 wherein the step of depositing the second layer of material on the first layer includes conformally depositing the second layer on the first layer.

24. A method of fabricating a plurality of spaced apart submicron memory cells as claimed in claim 20 wherein the step of etching the second layer of material to define spacers includes performing a reactive ion etch on the second layer.

25. A method of fabricating a plurality of spaced apart submicron memory cells as claimed in claim 20 wherein the steps of depositing the first layer of material and depositing the second layer of material include depositing a first layer of $Si_3N_4$ and depositing a second layer of $SiO_2$.

26. A method of fabricating a plurality of spaced apart submicron memory cells as claimed in claim 20 wherein the step of depositing electrical contacts includes depositing and patterning high coercivity material on the magnetoresistive system to pin magnetic vectors in the magnetoresistive material and define ends of the spaced apart submicron magnetic memory cells.

27. A method of fabricating a plurality of spaced apart submicron memory cells as claimed in claim 26 wherein the step of depositing electrical contacts further includes depositing a layer of metal on the high coercivity material to electrically connect the ends of the spaced apart submicron magnetic memory cells.

* * * * *